United States Patent
Suda (10) Patent No.: US 7,944,263 B2
(45) Date of Patent: May 17, 2011

(54) TIMING GENERATOR AND SEMICONDUCTOR TEST APPARATUS

(75) Inventor: Masakatsu Suda, Tokyo (JP)

(73) Assignee: Advantest Corp., Tokyo (JP)

(*) Notice: Subject to any disclaimer, the term of this patent is extended or adjusted under 35 U.S.C. 154(b) by 483 days.

(21) Appl. No.: 11/989,714

(22) PCT Filed: Jul. 28, 2006

(86) PCT No.: PCT/JP2006/314954
§ 371 (c)(1),
(2), (4) Date: May 27, 2008

(87) PCT Pub. No.: WO2007/013578
PCT Pub. Date: Feb. 1, 2007

(65) Prior Publication Data
US 2009/0230946 A1    Sep. 17, 2009

(30) Foreign Application Priority Data

Jul. 29, 2005   (JP) ................................. 2005-220767

(51) Int. Cl.
*H03H 11/26* (2006.01)
(52) U.S. Cl. .................... 327/269; 327/293; 327/295
(58) Field of Classification Search .......... 327/269–271, 327/293, 295
See application file for complete search history.

(56) References Cited

U.S. PATENT DOCUMENTS

| 5,670,899 A * | 9/1997 | Kohdaka ............... 326/97 |
| 6,046,607 A * | 4/2000 | Kohdaka ............... 326/97 |
| 6,111,448 A * | 8/2000 | Shibayama ........... 327/293 |
| 6,191,632 B1 * | 2/2001 | Iwata et al. ........... 327/295 |
| 7,023,252 B2 * | 4/2006 | Schultz ................. 327/161 |
| 2005/0110544 A1 | 5/2005 | Suda et al. |

FOREIGN PATENT DOCUMENTS

| JP | 08-94725 | 4/1996 |
| JP | 08-320360 | 12/1996 |
| JP | 11-511565 | 10/1999 |
| JP | 2001-235521 | 8/2001 |
| JP | 2002-267725 | 9/2002 |

* cited by examiner

*Primary Examiner* — Lincoln Donovan
*Assistant Examiner* — William Hernandez
(74) *Attorney, Agent, or Firm* — Muramatsu & Associates (57) ABSTRACT

A timing generator reduces operation-dependent power consumption (AC component) and noises generated from a clock distribution circuit itself in distributing a clock, and further reduces a skew attributed to the clock distribution. A clock distribution circuit 20 for distributing the clock to timing generating sections 10-1 to 10-n has a clock main path 21 connected to a main path buffer 24 and a clock return path 26 connected to a return path buffer 27. A load capacity of the main path buffer 24 is equal to that of the return path buffer 27. Biases of the buffers are the same potential and are generated by a delay locked-loop circuit 30. A propagation delay time of the clock distribution circuit is controlled so as to be an integral multiple of a clock period.

7 Claims, 7 Drawing Sheets

(a): SINGLE SIMPLIFIED DELAY CIRCUIT (b): SINGLE DELAY CIRCUIT (c): DIFFERENTIAL DELAY CIRCUIT

TIMING GENERATOR AND SEMICONDUCTOR TEST APPARATUS

TECHNICAL FIELD

The present invention relates to a timing generator for providing a predetermined delay amount to a data signal and then outputting the data signal, and to a semiconductor test apparatus equipped with this timing generator. More particularly, it relates to a timing generator in which an operation-dependent power consumption (an AC component) and noises generated from a distribution circuit itself are small in distributing a clock and data, and a skew between timing generating sections due to clock distribution can be reduced, and it also relates to a semiconductor test apparatus equipped with this timing generator.

BACKGROUND ART

Before describing the present invention, a conventional semiconductor test apparatus is explained with reference to FIG. 4 to make it easier to understand the present invention.

Figure 4:
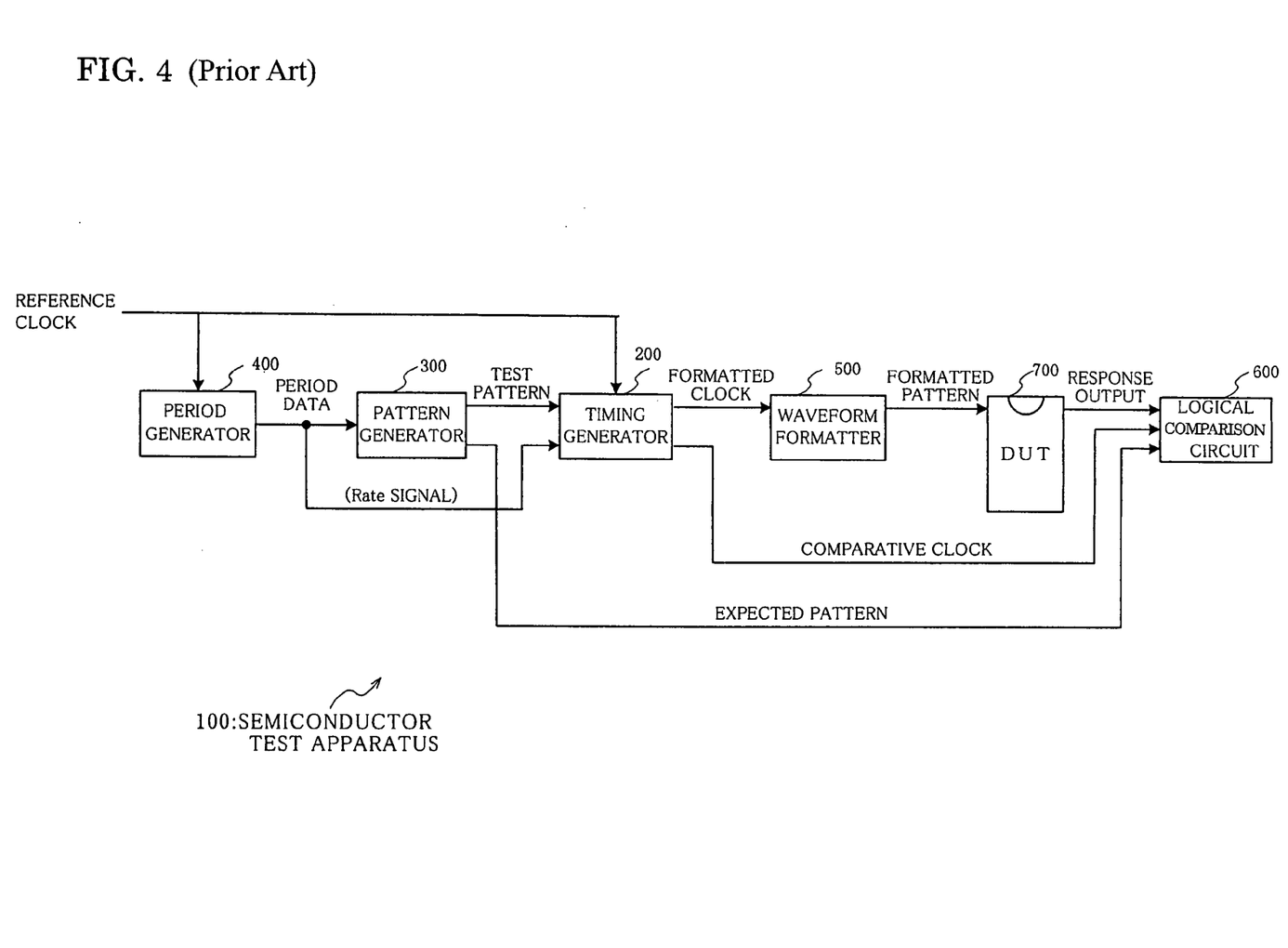
FIG. 4 is a block diagram showing a configuration of a conventional semiconductor test apparatus.

As shown in FIG. 4, a semiconductor test apparatus 100 generally comprises a period generator 400, a pattern generator 300, a timing generator 200, a waveform formatter 500 and a logical comparison circuit 600.

The period generator 400 outputs period data on the basis of an input reference clock. The period data is sent to the pattern generator 300 and also sent to the timing generator 200 as a Rate signal (see FIG. 6). The period generator 400 generates an address for saving data in memories 211-2, 211-3 described later (see FIGS. 5, 8).

The pattern generator 300 outputs a test pattern signal and an expected pattern signal on the basis of the period data. The test pattern signal is sent to the timing generator 200, and the expected pattern signal is sent to the logical comparison circuit 600.

The reference clock signal, the test pattern signal and the period data signal (Rate signal) are input to the timing generator 200, and the timing generator outputs a formatted clock signal and a comparative clock signal. The formatted clock signal is sent to the waveform formatter 500, and the comparative clock signal is sent to the logical comparison circuit 600.

The waveform formatter 500 formats the formatted clock signal into a waveform necessary for a test, and then sends a formatted pattern signal to a semiconductor device under test (hereinafter also abbreviated as "DUT" (device under test)) 700.

The logical comparison circuit 600 compares a response output of the DUT 700 with the expected pattern signal on the basis of the comparative clock signal. Thus, whether the DUT 700 is good or bad is judged depending on whether the response output corresponds to the expected pattern signal.

Next, the basic configuration of the timing generator is explained with reference to FIG. 5.

Figure 5:
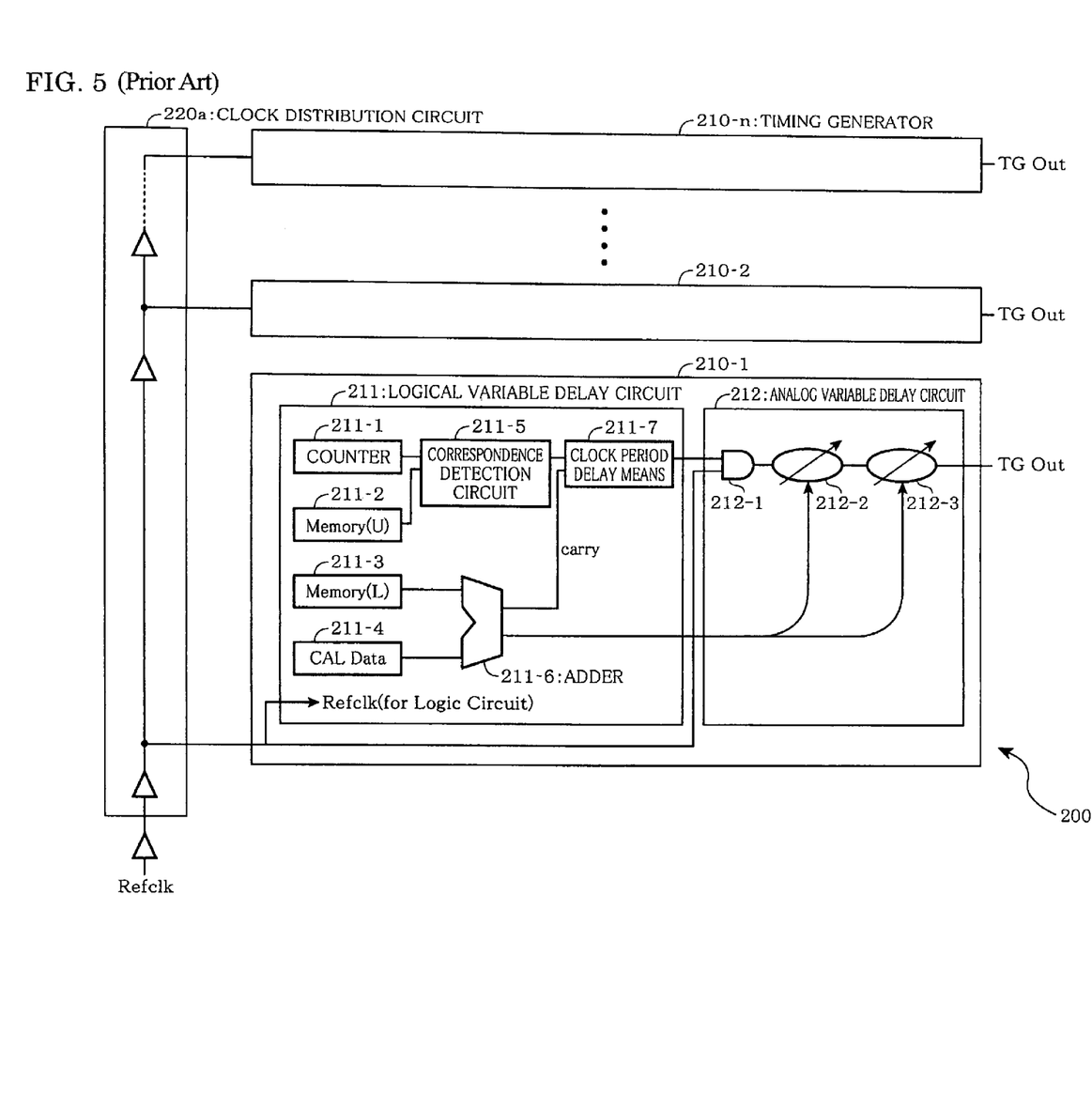
FIG. 5 is a circuit diagram showing a configuration of a conventional timing generator.

FIG. 5 is a schematic configuration diagram showing a configuration example of the timing generator commonly used today.

As shown in FIG. 5, a timing generator 200a comprises a plurality of timing generating sections 210-1 to 210-n for outputting a signal (TG OUT) to which a predetermined delay amount has been added, and a clock distribution circuit 220a which distributes a clock to these timing generating sections 210-1 to 210-n.

As shown in the drawing, each of the timing generating sections 210-1 to 210-n includes a logical variable delay circuit 211 which generates and outputs a signal indicating a delay time on the basis of a reference signal Refclk, and an analog variable delay circuit 212 which provides a delay amount to a data signal on the basis of the signal from this logical variable delay circuit 211.

The logical variable delay circuit 211 includes a counter 211-1, first storage means (Memory(U)) 211-2, second storage means (Memory(L)) 211-3, calibration data storage means (CAL Data) 211-4, a correspondence detection circuit 211-5, an adder 211-6 and clock period delay means 211-7.

As shown in FIG. 5, the analog variable delay circuit 212 includes an AND circuit 212-1, a first variable delay circuit 212-2, and a second variable delay circuit 212-3.

Next, an operation of the timing generator will be described with reference to FIG. 6.

Figure 6:
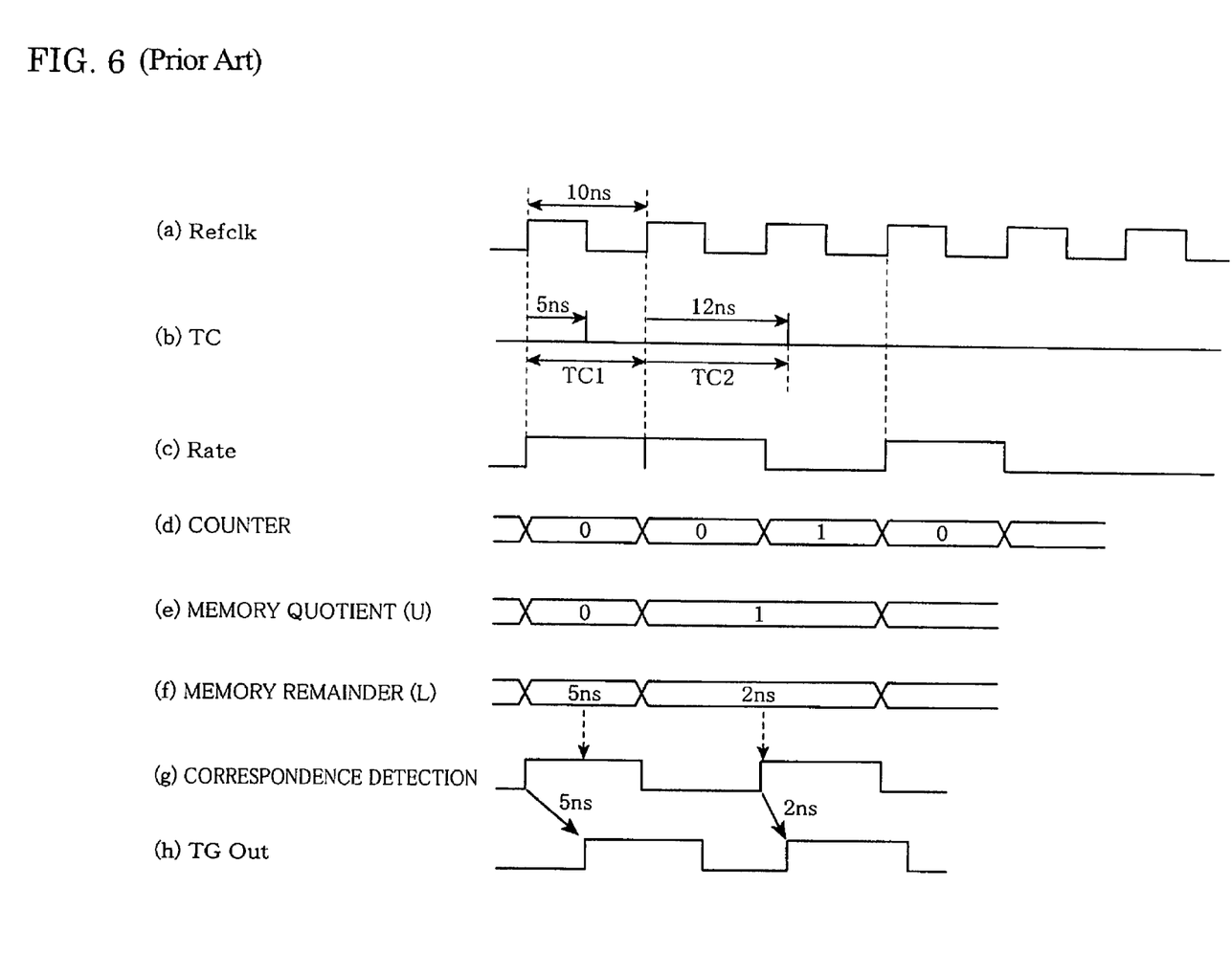
FIG. 6 is a timing chart showing a change of each waveform with time in the timing generator shown in FIG. 5.

FIG. 6 is a timing chart showing a change of each signal with time in each constituting section of the timing generator.

As shown in the drawing, it is assumed that a reference clock (Refclk) signal having a period of 10 ns is input to the timing generator 200a (FIG. 6(a)).

Then, an output timing (test cycle TC) of a signal (TG Out, a delay clock in the semiconductor test apparatus 100) output from the timing generator 200a includes a point (TC1) 5 ns from a first start, and a point (TC2) 12 ns from a second start (after one period of the Refclk signal from the first start) (FIG. 6(b)).

A Rate signal indicating a start point is input to the timing generator 200a (FIG. 6(c)). In response to the input of the Rate signal, the counter 211-1 is cleared to 0 (FIG. 6(d)). Then, when the Rate signal is not input, the counter 211-1 is incremented one by one at each period of the Refclk signal (FIG. 6(d)).

The first storage means 211-2 stores a quotient when the test cycle (TC) of the output signal (TG Out) is divided by the period of the Refclk signal.

Furthermore, the second storage means 211-3 stores a remainder when the test cycle (TC) of the output signal (TG Out) is divided by the period of the Refclk signal.

For example, with regard to 5 ns which is the test cycle of the first output signal, the quotient and remainder are calculated using the following equation:

$$5 \div 10 = 0 \ldots 5 \qquad \text{(Equation 1)}$$

A quotient of 0 and a remainder of 5 ns are calculated by Equation 1. The quotient "0" is stored in the first storage means 211-2, and the remainder "5 ns" is stored in the second storage means 211-3 (FIG. 6(e), (f)).

Moreover, with regard to, for example, 12 ns which is the test cycle of the second output signal, the quotient and remainder are calculated using the following equation:

$$12 \div 10 = 1 \ldots 2 \qquad \text{(Equation 2)}$$

A quotient of 1 and a remainder of 2 ns are calculated by Equation 2. The quotient "1" is stored in the first storage means 211-2, and the remainder "2 ns" is stored in the second storage means 211-3 (FIG. 6(e), (f)).

Furthermore, the correspondence detection circuit 211-5 detects the correspondence (match) between a counted value of the counter 211-1 and data stored in the first storage means 211-2. The correspondence detection circuit outputs a detection signal when the two correspond to each other, but outputs no detection signal when the two do not correspond to each other.

For example, at the first cycle of the Refclk signal, the counted value corresponds to the stored data because the counter indicates "0" and the memory indicates "0". In this case, a detection signal is output (FIG. 6(g)).

Furthermore, for example, at the second cycle of the Refclk signal, the counted value does not correspond to the stored data because the counter indicates "0" and the memory indicates "1". In this case, no detection signal is output (FIG. 6($g$)).

Then, for example, at the third cycle of the Refclk signal, the counted value corresponds to the stored data because the counter indicates "1" and the memory indicates "1". In this case, a detection signal is output (FIG. 6($g$)).

The adder 211-6 adds up the remainder stored in the second storage means 211-3 and CAL Data stored in the calibration data storage means 211-4 to send the result to the clock period delay means 211-7.

In response to the detection signal from the correspondence detection circuit 211-5 and an addition result (Carry) from the adder 211-6, the clock period delay means 211-7 sends, to the variable delay circuit 212, a delay amount signal (coarse resolution delay amount signal) whose resolution is equal to one cycle of the Refclk signal.

This clock period delay means 211-7 is specifically a combination of a shift register and a selector, and shifts such a position to select the timing of the Refclk signal, to generate the delay with the resolution of the period of the Refclk signal.

Upon receiving the delay amount signal from the clock period delay means 211-7 of the logical variable delay circuit 211 and the clock from the clock distribution circuit 220$a$, the AND circuit 212-1 of the analog variable delay circuit 212 outputs the delay amount signal.

The first variable delay circuit (Coarse Delay) 212-2 delays the data signal with a coarse resolution.

The second variable delay circuit (Fine Delay) 212-3 delays the data signal with a fine resolution. This delayed data signal is output as TG OUT.

According to such a configuration, the timing generator 200$a$ can generate a desired delay time in an analog manner to output a delay clock.

However, in recent years, with miniaturization of a semiconductor device, a scale of a circuit to be mounted on one chip of an LSI increases, and it increasingly becomes difficult to distribute the clock and the data.

This also applies to design of the timing generator. It is demanded in distributing the clock that a propagation delay time be short, a skew between the timing generating sections be minimized, power consumption be small and noises generated by the circuit itself be low, but in reality, trade-off of these conditions must be made to realize the distribution of the clock and the data (e.g., see Japanese Patent Publication Laid-open No. 2001-235521 and Japanese Patent Publication Laid-open No. 8-94725).

Figure 7:
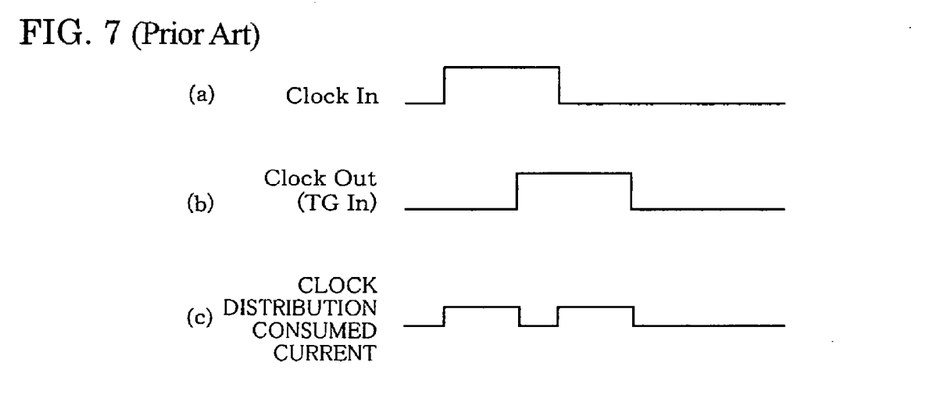
FIG. 7 is a waveform diagram showing a clock distribution consumed current and the like in a clock distribution method shown in FIG. 5.

For example, the conventional clock distribution method shown in FIG. 5 is designed so that an equal load capacity is obtained with buffers having the same driving capability. In this technique, the buffers have the same driving capability and the equal load capacity, so that a peak of a consumed current is distributed in a time direction, and a current waveform is a rectangular wave as shown in FIG. 7. As shown by this rectangular wave, the peak of the consumed current is distributed in the time direction, and hence the noises are reduced.

Figure 8:
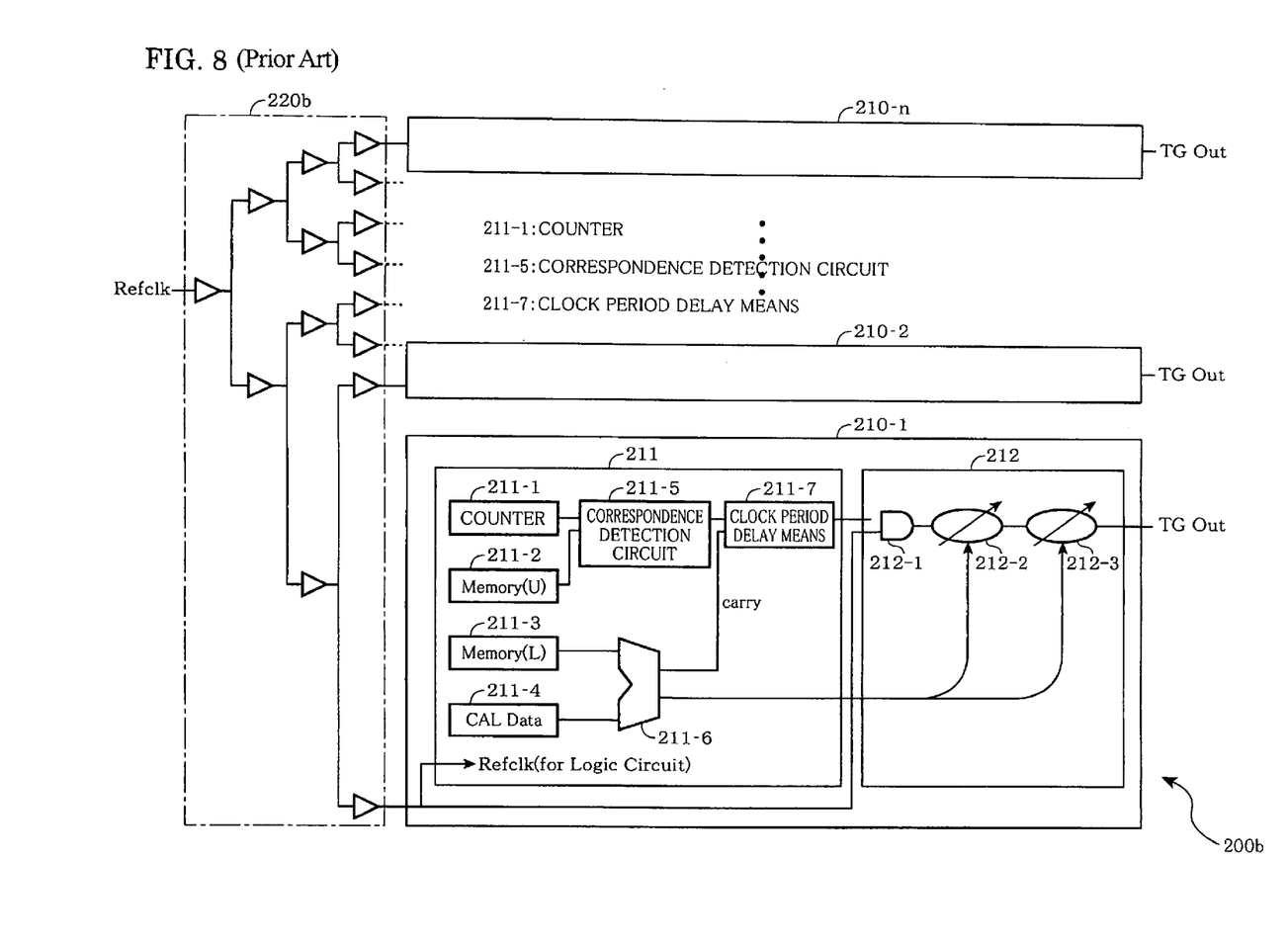
FIG. 8 is a circuit diagram showing another configuration of the conventional timing generator.

Moreover, in addition to the clock distribution technique shown in FIG. 5, a clock distribution technique shown in FIG. 8 is also known. This technique is similar to a clock distribution structure referred to as an "H-Tree structure", which increases distribution stages in a reverse tournament system. In this distribution technique, fan-out, wiring lines and the like of a distribution destination are set to the same conditions, and a wiring line delay and a load capacity are set to be equal, whereby a difference of a delay time between distribution paths can be set to be equal.

Patent document 1: Japanese Patent Publication Laid-open No. 2001-235521

Patent document 2: Japanese Patent Publication Laid-open No. 8-94725

DISCLOSURE OF THE INVENTION

However, in the conventional clock distribution method shown in FIG. 5, a pulse width of a rectangular wave of a clock distribution consumed current shown in FIG. 7 changes with changes of a process and use conditions such as a voltage and a temperature, and hence the method has a problem that a noise generation situation changes.

Moreover, when a clock distribution region broadens, the numbers of stages of buffers increase, and thus, even a distribution circuit alone sometimes has a propagation delay time of several nanoseconds. For example, in a CMOS circuit, a delay time fluctuation of 0.07% to 0.10% occurs with respect to a voltage fluctuation of 1 mV, thus, precision of a timing generator might crucially be deteriorated.

Figure 9:
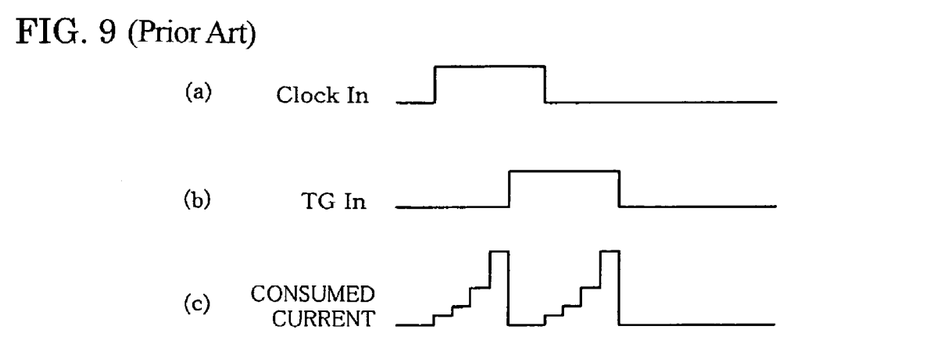
FIG. 9 is a waveform diagram showing a clock distribution consumed current and the like in a clock distribution method shown in FIG. 8.

Further, in the conventional clock distribution method shown in FIG. 8, a long wiring line and a large fan-out circuit are driven using a buffer having a high driving capability. Therefore, as shown in FIG. 9, a current is consumed in a concentrated manner with respect to time, and a bypass condenser generates noises having a large frequency band which cannot be compensated.

Moreover, when the clock distribution region is broad, the number of the stages of the buffers increases, and even the distribution circuit alone sometimes has a propagation delay time of several nanoseconds.

In addition, in the CMOS circuit, a delay time fluctuation of 0.07% to 0.10% occurs with respect to a voltage fluctuation of 1 mV, and the precision of the timing generator might crucially be deteriorated.

The present invention has been made in view of the foregoing problem, and an object is to provide a timing generator capable of reducing an operation-dependent power consumption (an AC component) in distributing a clock and data, reducing noises generated from a distribution circuit itself, and reducing a skew attributed to clock distribution between a plurality of timing generating sections, and a semiconductor test apparatus including the timing generator.

In order to achieve this object, the present invention provides a timing generator comprising: a plurality of timing generating sections which provide a predetermined delay amount to a data signal to output the signal; and a clock distribution circuit which distributes a clock to these timing generating sections, the clock distribution circuit including a clock main path which transmits the clock, a clock return path which returns the clock transmitted by the clock main path, and a bias generation circuit which is provided with a transmitted clock input to the clock main path and a returned clock returned from the clock return path. The clock main path has a main path buffer which provides a predetermined delay amount to the clock to be transmitted, the clock return path has a return path buffer which provides a predetermined delay amount to the clock to be returned, a load capacity of the main path buffer is equal to that of the return path buffer. The bias generation circuit is configured to generate a bias which provides an equal potential to the main path buffer and the return path buffer and then sends the bias to the main path buffer and the return path buffer.

In such a configuration of the timing generator, it is designed that the load capacity of the main path buffer connected to (inserted in) the clock main path becomes equal to that of the return path buffer connected to (inserted in) the clock return path. Furthermore, the bias for providing an equal potential is supplied to both the main path buffer and the return path buffer, and hence the power consumption of the buffer of each stage becomes identical to one another. Further, a delay time of the distribution circuit is controlled so as to be an integral multiple of a clock period, whereby a clock distribution consumed current has a flat waveform in a time direction, and any noise is not generated. Therefore, this does not cause a problem that a pulse width of a rectangular wave of the clock distribution consumed current shown in FIG. 7 changes with changes of a process and use conditions such as a voltage and a temperature and that a noise generation situation accordingly changes.

Moreover, in the timing generator of the present invention, it is constituted that the bias generation circuit has a delay locked loop circuit, and this delay locked loop circuit inputs the transmitted clock input to the clock main path and the returned clock returned from the clock return path to generate the bias on the basis of the transmitted clock and the returned clock.

In such a configuration of the timing generator, the DLL (delay locked loop) circuit generates the bias, the propagation delay time of the clock distribution circuit is controlled so as to be the integral multiple of the clock period, and accordingly, a change in an external power supply voltage or temperature, if any, is compensated, so that it is possible to maintain a constant delay time of the distribution circuit.

Moreover, in the timing generator of the present invention, the main path buffer and the return path buffer include a plurality of cascaded buffers which control, with a current source, an amount of a current to charge the load capacity.

According to such a configuration of the timing generator, to distribute the clock and the data, it is constituted that the buffers are cascaded which control, with the current source, the amount of the current to charge the load capacity. Therefore, the timing generator is designed so that the load capacities of the respective buffers are set to be equal, an equal potential of biases is supplied to the buffers, and the propagation delay time of the clock distribution circuit is controlled to be the integral multiple of the clock period, whereby the respective stages of the buffers have an equal power consumption, a waveform of the consumed current is flattened in a time direction, and noises are reduced, or frequency components of the noises can be reduced.

Furthermore, the present invention provides a semiconductor test apparatus comprising: a period generator which outputs period data on the basis of an input reference clock; a pattern generator which outputs a test pattern signal and an expected pattern signal on the basis of the period data; a timing generator to which the reference clock, the period data and the test pattern signal are input to generate a formatted clock signal and a comparative clock signal; a waveform formatter which formats the formatted clock signal to output and send a formatted pattern signal to a semiconductor device to be tested; and a logical comparison circuit which compares a response output of the semiconductor device with the expected pattern signal on the basis of the comparative clock signal. The timing generator is configured in the manner described in the foregoing.

When the semiconductor test apparatus has such a configuration, a delay clock generated on the basis of the clock having the reduced noises can be obtained from the timing generator. This can increase measurement accuracy in various tests of a DUT.

As described above, according to the present invention, the clock distribution circuit includes the clock main path which transmits the clock signal, the clock return path which returns the clock signal, the main path buffer connected to the clock main path and the return path buffer connected to the clock return path, and it is designed that the load capacity of the main path buffer is equal to that of the return path buffer. It is constituted that the biases of equal potential are provided to the buffers, and the DLL controls the propagation delay time of the clock distribution circuit to become the integral multiple of the clock period, whereby the buffers of the respective stages have the equal power consumption, the waveform of the consumed current is flattened in the time direction, and the noises can be reduced or the frequency components of the noises can be reduced. Therefore, in the distribution of the clock and the data, the operation-dependent power consumption (AC component) can be reduced, and the noises generated from the distribution circuit itself can be reduced.

DESCRIPTION OF REFERENCE NUMBERS 1 timing generator
10-1 to 10-n timing generating sections
11 logical variable delay circuit
12 analog variable delay circuit
20 clock distribution circuit
21 clock main path
22 clock branch path
23 clock branch point
24 main path buffer
25 clock input terminal
26 clock return path
27 return path buffer
28 bias path
30 delay locked loop circuit (DLL)
31 phase comparator
32 counter
33 DA converter

BEST MODE FOR CARRYING OUT THE INVENTION

A preferred embodiment of a timing generator and a semiconductor test apparatus according to the present invention will hereinafter be described with reference to the drawings.

First, the embodiment of the timing generator of the present invention will be described with reference to FIG. 1.

Figure 1:
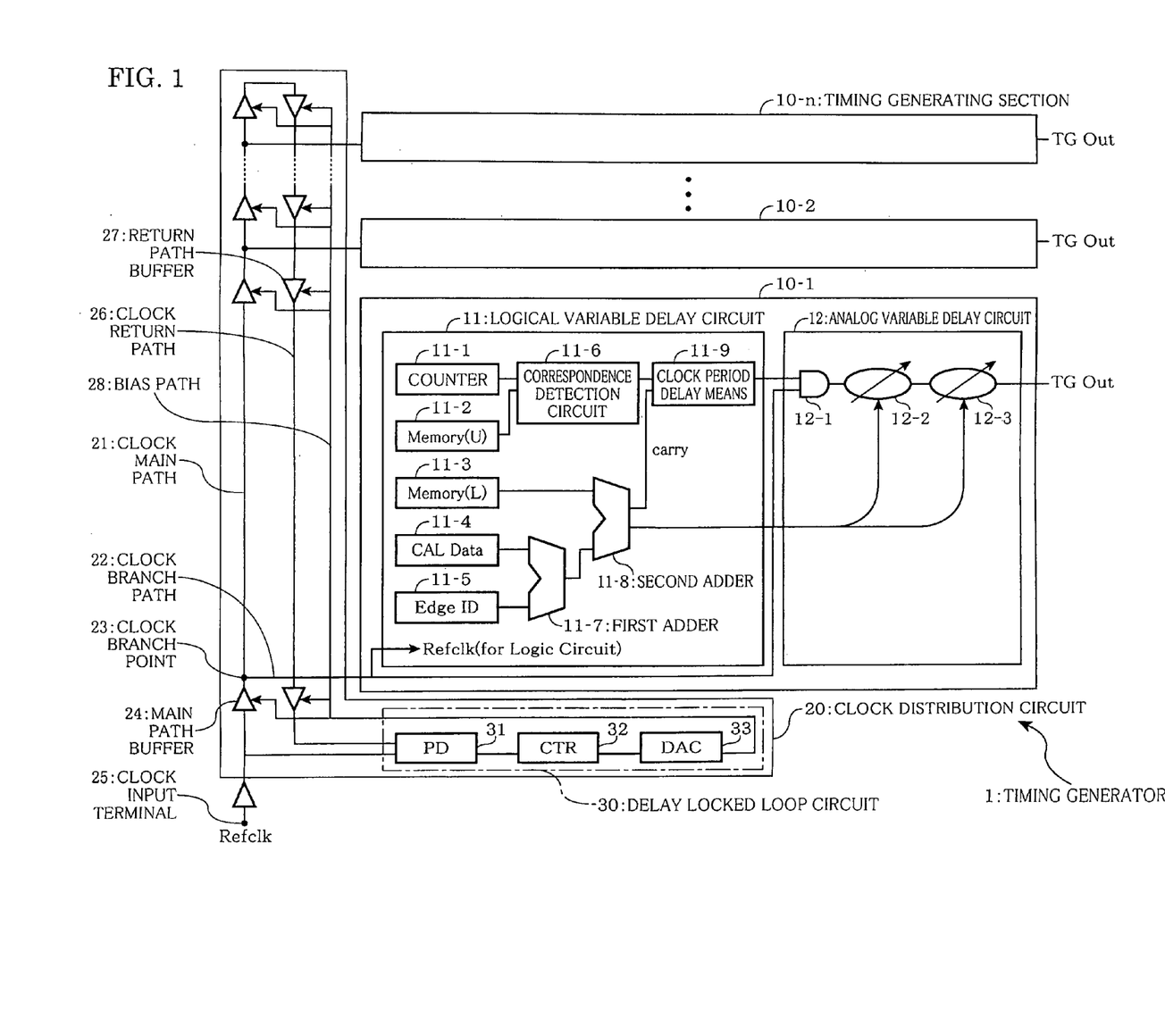
FIG. 1 is a circuit diagram showing a configuration of a timing generator of the present invention.

FIG. 1 is a block diagram showing the configuration of the timing generator of the present embodiment.

As shown in FIG. 1, a timing generator 1 of the present embodiment includes a plurality of timing generating sections 10-1 to 10-n and a clock distribution circuit 20.

As shown in FIG. 1, each of the timing generating sections 10-1 to 10-n includes a logical variable delay circuit 11 and an analog variable delay circuit 12.

The logical variable delay circuit 11 includes a counter 11-1, first storage means (Memory(U)) 11-2, second storage means (Memory(L)) 11-3, calibration data storage means (CAL Data) 11-4, edge ID storage means (EdgeID) 11-5, a correspondence detection circuit 11-6, a first adder 11-7, a second adder 11-8 and clock period delay means 11-9.

The calibration data storage means 11-4 stores CALData.

The calibration data (CALData) is data which offsets (augments) a setting of the timing generator.

A skew (a deviation of a propagation delay time between components) is generated among the plurality of timing generating sections 10-1 to 10-n, and hence correction needs to be performed. This correction includes measuring the propagation delay time at a time when all the timing generating sections 10-1 to 10-n are set in the same manner, and augmenting (offsetting) the setting of the timing generating sections in order to adjust phases of the timing generating sections to a an amount identical to the phase of the timing generating section having the latest phase. This augmenting value is "CALData", and an operation of measuring and incorporating the CALData is calibration.

The edge ID storage means 11-5 stores an edge ID (EdgeID) where the EdgeID is data for calibrating the skew of the clock distribution circuit.

In a clock distribution system of the present embodiment, the skew between adjacent timing generators is one integral fraction, i.e., an integral submultiple, of a clock period. For example, assuming that a clock period is 2 ns and the number of stages of reciprocating buffers is 32, the skew between the adjacent timing generating sections is 62.5 ps (i.e., the result of dividing 2 ns by 32).

The timing generator closest to an input side of Refclk has a delay time of 62.5 ps owing to the distribution circuit, a second stage of the timing generator has a delay time of 62.5 ps*2=125 ps, and the timing generator closest to a return portion of the distribution circuit has a delay time of 62.5 ps*8=500 ps.

In this example, depending on a position of layout of the timing generator, the timing generator has second CALData of 62.5 ps*n, and this value is added to CALData, whereby the skew of the clock distribution circuit can be calibrated. This second CALData is referred to as the edge ID.

The first adder 11-7 adds up the CALData stored in the calibration data storage means 11-4 and the EdgeID stored in the edge ID storage means 11-5 to output the result.

The second adder 11-8 adds up a remainder stored in the second storage means 11-3 and the output of the first adder 11-7 to send the result to the clock period delay means 11-9.

It is to be noted that configurations and operations of the counter 11-1, the first storage means 11-2, the second storage means 11-3, the correspondence detection circuit 11-6 and the clock period delay means 11-9 in the logical variable delay circuit 11 are similar to those of the counter 211-1, the first storage means 211-2, the second storage means 211-3, the correspondence detection circuit 211-5 and the clock period delay means 211-7 in the logical variable delay circuit 211, and hence description thereof is omitted.

The analog variable delay circuit 12 includes an AND circuit 12-1, a variable delay circuit (Course Delay) 12-2 and a variable delay circuit (Fine Delay) 12-3.

It is to be noted that a configuration and an operation of this analog variable delay circuit 12 are similar to those of the conventional analog variable delay circuit 212, and hence description thereof is omitted.

It is to be noted that in the present embodiment, the timing generator includes a plurality of timing generating sections, but the present invention is not limited to a plurality of timing generating sections, and only one timing generating section may be disposed.

The clock distribution circuit 20 is a circuit for distributing clocks to the respective timing generating sections 10-1 to 10-n, and includes, as shown in FIG. 1, a clock main path 21, a clock branch path 22, a clock branch point 23, a main path buffer 24, a clock input terminal 25, a clock return path 26, a return path buffer 27, a bias path 28 and a delay locked loop circuit (DLL) 30.

The clock main path 21 is a path which transmits an input clock (Refclk).

The clock branch path 22 is a path which connects each of the timing generating sections 10-1 to 10-n to the clock main path 21, and sends the clock from the clock main path 21 to the timing generating sections 10-1 to 10-n.

The clock main path 21 has a point from which the clock branch path 22 branches, that is, the clock branch point 23 connected to the clock main path 21 and the clock branch path 22.

Furthermore, the main path buffers 24 are connected between the plurality of clock branch points 23 in the clock main path 21.

The main path buffer 24 is a buffer which provides a predetermined delay amount to the clock.

This main path buffer 24 is connected between the clock input terminal 25 and the clock branch point 23 closest to this clock input terminal 25.

It is to be noted that a configuration of the main path buffer 24 will be described later in "regarding configurations of the main path buffer and the return path buffer".

The clock return path 26 is a path which returns, to the vicinity of the clock input terminal 25, the clock transmitted to an end of the clock return path along the clock main path 21. A start point of the clock return path 26 may be disposed on the clock main path 21 or the clock branch path 22.

This clock return path 26 is connected to the return path buffer 27.

The return path buffer 27 is connected to each stage of the main path buffer 24 connected to the clock main path 21. That is, the number of the stages of the main path buffers 24 is equal to that of the stages of the return path buffers 27.

The bias path 28 sends the bias output from the DLL 30 to each stage of the main path buffer 24 and the return path buffer 27.

As shown in FIG. 1, the delay locked loop (DLL) 30 includes a phase detector (PD) 31, a counter (CTR) 32 and a DA converter (DAC) 33.

The phase detector 31 inputs the clock to be input to the clock main path 21 and the clock returned along the clock return path 26, detects a phase difference between these signals, and outputs this detection result as a phase signal.

The counter 32 inputs a phase signal from the phase detector 31, and generates a control signal on the basis of the phase signal of the phase detector to output the signal.

The DA converter 33 digital-analog converts the control signal from the counter 32 to output a delay time control signal (BIAS signal). This BIAS signal is propagated along a bias path 40 and transmitted to the main path buffer 24 and the return path buffer 27.

According to such a configuration, the DLL 30 controls the BIAS signal so that the propagation delay time in the clock wiring line (the clock main path 21 and the clock return path 26) becomes equal to an integral multiple of the clock period.

Figure 2:
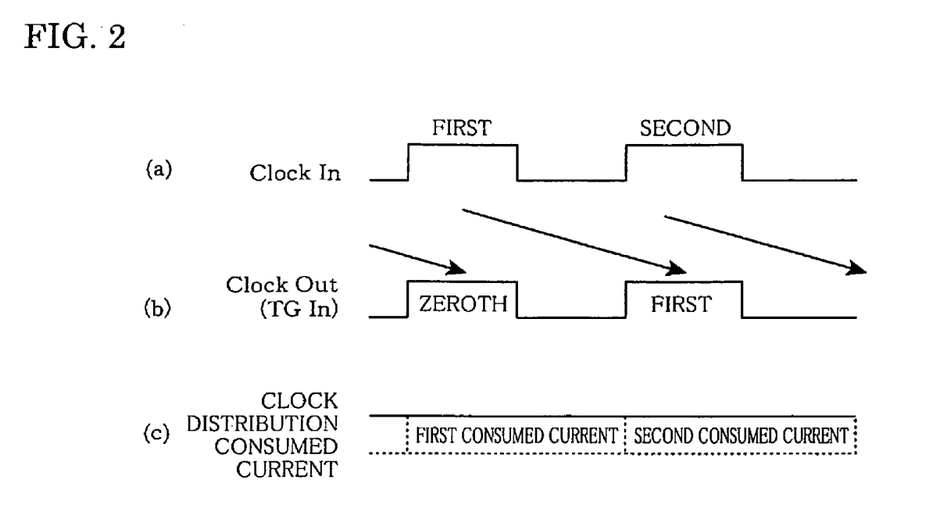
FIG. 2 is a timing chart showing a change of each waveform with time in the timing generator according to the present invention.

The delay time control signal (the BIAS signal) generated by this DLL 30 is provided to each stage of the main path buffer 24 and the return path buffer 27, whereby the power consumption of each stage can be set to be equal. The propagation delay time in the clock wiring line is controlled into an integral multiple of the clock period. In consequence, as shown in FIG. 2(c), a waveform of the consumed current is flattened. Therefore, noises in the clock wiring line can be reduced, or frequency components of the noises can be reduced.

FIG. 2 is a waveform diagram showing waveforms of a clock ((a) Clock In) input to the clock main path 21, a clock ((b) Clock Out (TG In)) output from the clock main path 21, and a consumed current ((c) Clock distribution consumed current) in the clock distribution circuit 20, respectively.

In FIG. 2, for example, from a time when a first clock is input to the clock main path 21 to a time when the clock is output, the clock is delayed by a predetermined time because of the main path buffer 24 (FIG. 2(a), (b)), while it can be understood from (c) that the consumed current is suppressed in the clock main path 21 with respect to the time.

Furthermore, the delay time of the buffer is controlled with the DLL, whereby a change in an external power supply voltage or temperature, if any, is compensated, so that it is possible to maintain a constant delay time of the clock wiring line.

Next, the configurations of the main path buffer and the return path buffer will be explained with reference to FIG. 3.

Figure 3:
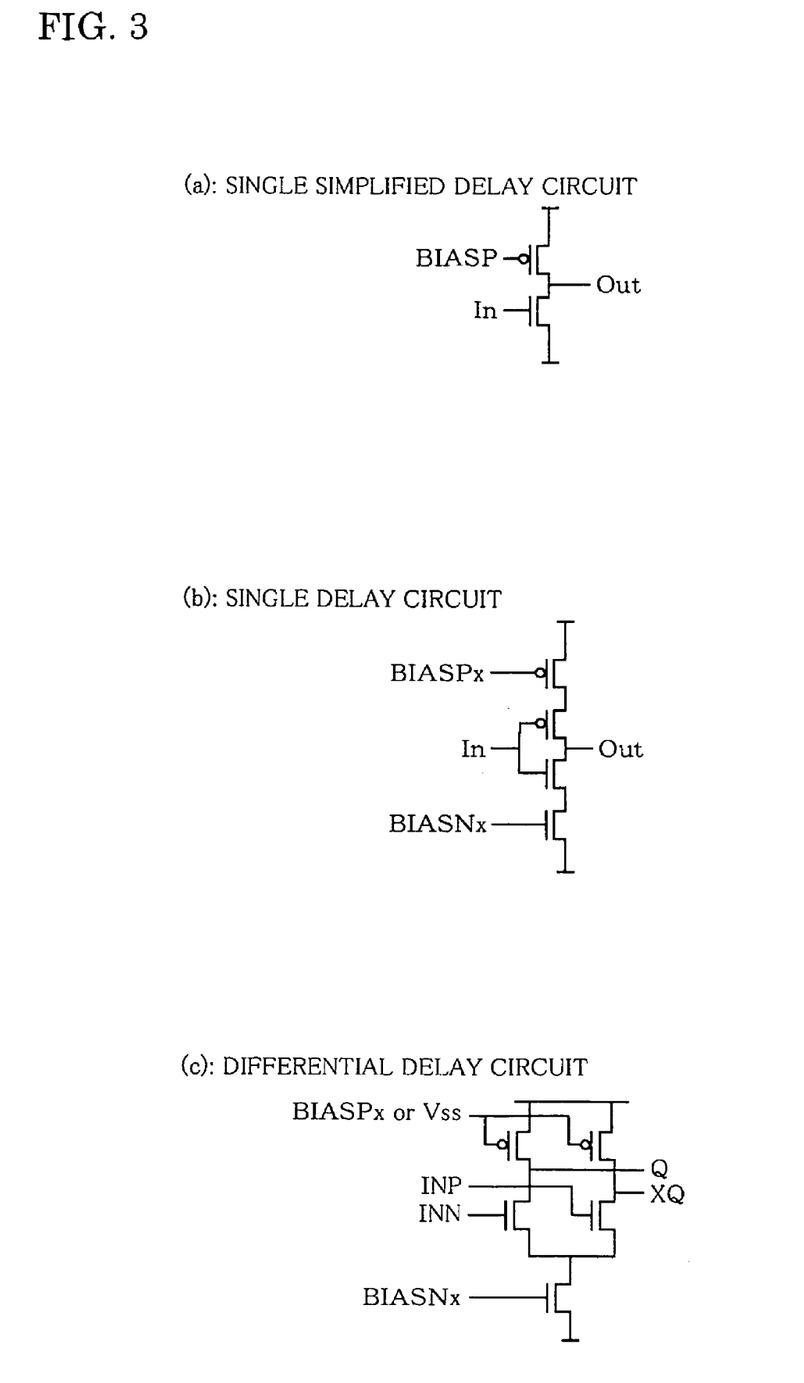
FIG. 3 is a block diagram showing a constitution of a buffer.

FIG. 3 shows circuit diagrams of configuration examples of the buffer (including both the main path buffer 24 and the return path buffer 27), wherein (a) shows a single simplified delay circuit, (b) shows a single delay circuit, and (c) shows a differential delay circuit. In addition, the buffer can be configured by any one of (a), (b) and (c) in FIG. 3.

The single simplified delay circuit has a P-channel MOSFET and an N-channel MOSFET, as shown in FIG. 3(a).

The drain of the N-channel MOSFET is connected to the source of the P-channel MOSFET. The source of the N-channel MOSFET is grounded, and a predetermined voltage is applied to the drain of the P-channel MOSFET. Further, BIASP is input to the gate of the P-channel MOSFET, and a signal (a clock in a clock path, data in a data path) is input to the gate of the N-channel MOSFET (In). Then, a signal (a clock in the clock path, data in the data path) delayed in accordance with the BIASP is output from a connection point between the drain of the N-channel MOSFET and the source of the P-channel MOSFET (Out).

The single delay circuit has two P-channel MOSFETs and two N-channel MOSFETs, as shown in FIG. 3(b).

The source of the first P-channel MOSFET is connected to the drain of the second P-channel MOSFET. The source of the second P-channel MOSFET is connected to the drain of the first N-channel MOSFET. The source of the first N-channel MOSFET is connected to the drain of the second N-channel MOSFET. Further, the source of the second N-channel MOSFET is grounded, and a predetermined voltage is applied to the drain of the first P-channel MOSFET. Moreover, BIASPx is input to the gate of the first P-channel MOSFET, and BIASNx is input to the gate of the second N-channel MOSFET. A signal (a clock in a clock path, data in a data path) is input to the gate of the second P-channel MOSFET and the gate of the first N-channel MOSFET (In). Then, a signal (a clock in the clock path, data in the data path) delayed in accordance with the BIASPx and BIASNx is output from a connection point between the source of the second P-channel MOSFET and the drain of the first N-channel MOSFET (Out)

That is, the single delay circuit has a configuration in which a CMOS inverter is provided in the middle and current sources are provided on both sides of the CMOS inverter.

The differential delay circuit is a combination of two single simplified delay circuits in which the sources of N-channel MOSFETs are connected to each other and in which a predetermined voltage is applied to the drains of P-channel MOSFETs, as shown in FIG. 3(c). Further, the drain of a third N-channel MOSFET is connected to a point where the sources of the N-channel MOSFETs are connected to each other, and the source of the third N-channel MOSFET is grounded.

Furthermore, signals (INP on one side, INN on the other side) are input to the gates of the N-channel MOSFETs of the two single simplified delay circuits, and a signal (BIASPx or Vss) is input to the gates of the P-channel MOSFETs of the single simplified delay circuits.

Then, a signal Q is output from one of the two single simplified delay circuits, and a signal XQ is output from the other.

Here, the operation of the single delay circuit is further explained.

When the inverter in the middle of this single delay circuit makes the transition to Hi, a current runs from a Hi-side current source (the first P-channel MOSFET) to a load (Out), such that a load capacity is charged. On the other hand, when the inverter makes the transition to a Low side, the current is then released from the load side to the current source side to make the transition. These running currents are used as a current source by the MOSFETs connected to both sides of the single delay circuit, and are controlled so that the currents run both in charging and discharging.

A certain kind of bias generation source is connected to the source of the current, and the current source is connected by a current mirror to a transistor at the final stage of the bias generation source. Due to the current mirror connection, the current passed by one bias generator is mirrored, and each current is mirrored. Thus, all the transistors are limited by the currents close to the bias current, and the current with which the load capacity is charged is controlled when each buffer makes the transition.

Next, the semiconductor test apparatus of the present invention will be described.

The semiconductor test apparatus of the present invention has a configuration equipped with the above-mentioned timing generator 1 having the clock distribution circuit 20. The configuration except for this timing generator is similar to the configuration shown in FIG. 4.

When the timing generator of the present embodiment is thus used, it is possible to run various tests of a DUT 700 with a good-quality delay clock generated on the basis of the clock which does not have any noise. This can increase the precision of a semiconductor test.

While the preferred embodiment of the timing generator and the semiconductor test apparatus of the present invention has been described above, it should be understood that the timing generator and the semiconductor test apparatus according to the present invention are not exclusively limited to the embodiment described above, and various modifications can be made within the scope of the invention.

For example, in the above-mentioned embodiment, the DLL is used as the bias generation circuit, but the bias generation circuit is not limited to the DLL as long as the circuit can output a signal which provides an equal potential to the buffers.

The present invention relates to a technique for reducing noises of a clock in a clock distribution circuit, and is therefore applicable to a timing generator equipped with the clock distribution circuit, a semiconductor test apparatus, and other apparatuses.

The invention claimed is:

1. A timing generator comprising: a plurality of timing generating sections which provide a predetermined delay amount to a data signal to output the data signal; and a clock distribution circuit which distributes a clock to these timing generating sections,
    the clock distribution circuit including:
        a clock main path which transmits the clock,
        a clock return path which returns the clock transmitted by the clock main path, and
        a bias generation circuit which is provided with a transmitted clock that is input to the clock main path and a returned clock that is returned from the clock return path,
        wherein the clock main path has a main path buffer which provides a predetermined delay amount to the clock to be transmitted, the clock return path has a return path buffer which provides a predetermined delay amount to the clock to be returned, and a load capacity of the main path buffer is equal to that of the return path buffer, and
        wherein the bias generation circuit is configured to generate a bias which provides an equal potential to the main path buffer and the return path buffer and then sends the bias to the main path buffer and the return path buffer.

2. The timing generator according to claim 1, wherein the bias generation circuit further comprises a delay locked loop circuit, and
    wherein the delay locked loop circuit inputs the transmitted clock input to the clock main path and the returned clock returned from the clock return path to generate the bias on the basis of the transmitted clock and the returned clock.

3. The timing generator according to claim 1, wherein the main path buffer and the return path buffer include a plurality of cascaded buffers which control, with a current source, an amount of a current to charge the load capacity.

4. A semiconductor test apparatus for testing semiconductor devices, comprising:
    a period generator which outputs period data on the basis of an input reference clock;
    a pattern generator which outputs a test pattern signal and an expected pattern signal on the basis of the period data;
    a timing generator to which the reference clock, the period data and the test pattern signal are input to output a formatted clock signal and a comparative clock signal;
    a waveform formatter which formats the formatted clock signal to output and send a formatted pattern signal to a semiconductor device; and
    a logical comparison circuit which compares a response output of the semiconductor device with the expected pattern signal on the basis of the comparative clock signal,
    wherein the timing generator comprises elements a plurality of timing generating sections which provide a predetermined delay amount to a data signal to output the data signal; and a clock distribution circuit which distributes a clock to these timing generating sections, the clock distribution circuit including: a clock main path which transmits the clock, a clock return path which returns the clock transmitted by the clock main path, and a bias generation circuit which is provided with a transmitted clock that is input to the clock main path and a returned clock that is returned from the clock return path, wherein the clock main path has a main path buffer which provides a predetermined delay amount to the clock to be transmitted, the clock return path has a return path buffer which provides a predetermined delay amount to the clock to be returned, and a load capacity of the main path buffer is equal to that of the return path buffer, and wherein the bias generation circuit is configured to generate a bias which provides an equal potential to the main path buffer and the return path buffer and then sends the bias to the main path buffer and the return path buffer.

5. The semiconductor test apparatus according to claim 4, wherein the timing generator further comprises a delay locked loop circuit, and wherein the delay locked loop circuit inputs the transmitted clock input to the clock main path and the returned clock returned from the clock return path to generate the bias on the basis of the transmitted clock and the returned clock.

6. The semiconductor test apparatus according to claim 5, wherein the main path buffer and the return path buffer in the timing generator include a plurality of cascaded buffers which control, with a current source, an amount of a current to charge the load capacity.

7. The timing generator according to claim 2, wherein the main path buffer and the return path buffer include a plurality of cascaded buffers which control, with a current source, an amount of a current to charge the load capacity.

* * * * *